United States Patent
Wang et al.

(10) Patent No.: US 9,153,690 B2
(45) Date of Patent: Oct. 6, 2015

(54) MOS DEVICES WITH MODULATED PERFORMANCE AND METHODS FOR FORMING THE SAME

(75) Inventors: Jelin Wang, Zhubei (TW); Ching-Chen Hao, Zhubei (TW); Yi-Huang Wu, Zhubei (TW); Meng Yi Sun, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 518 days.

(21) Appl. No.: 13/409,359

(22) Filed: Mar. 1, 2012

(65) Prior Publication Data

US 2013/0228826 A1    Sep. 5, 2013

(51) Int. Cl.
*H01L 27/088* (2006.01)
*H01L 29/78* (2006.01)
*H01L 21/8238* (2006.01)
*H01L 29/165* (2006.01)
*H01L 29/66* (2006.01)

(52) U.S. Cl.
CPC .... *H01L 29/7834* (2013.01); *H01L 21/823807* (2013.01); *H01L 21/823814* (2013.01); *H01L 21/823864* (2013.01); *H01L 29/165* (2013.01); *H01L 29/7848* (2013.01); *H01L 29/6656* (2013.01)

(58) Field of Classification Search
CPC ............... H01L 21/823807; H01L 21/823864; H01L 29/7834; H01L 29/6656
USPC .................... 257/192, 398, 288, 392, E29.242
See application file for complete search history.

(56) References Cited

U.S. PATENT DOCUMENTS

| | | | |
|---|---|---|---|
| 2008/0277735 A1* | 11/2008 | Ko et al. ...................... | 257/369 |
| 2009/0039445 A1* | 2/2009 | Wu ................................ | 257/392 |
| 2011/0070703 A1* | 3/2011 | Xiong et al. .................. | 438/231 |

* cited by examiner

*Primary Examiner* — Minchul Yang
(74) *Attorney, Agent, or Firm* — Slater & Matsil, L.L.P.

(57) ABSTRACT

A device includes a semiconductor substrate, a first Metal-Oxide-Semiconductor (MOS) device, and a second MOS device of a same conductivity as the first MOS device. The first MOS device includes a first gate stack over the semiconductor substrate, and a first stressor adjacent to the first gate stack and extending into the semiconductor substrate. The first stressor and the first gate stack have a first distance. The second MOS device includes a second gate stack over the semiconductor substrate, and a second stressor adjacent to the second gate stack and extending into the semiconductor substrate. The second stressor and the second gate stack have a second distance greater than the first distance.

14 Claims, 11 Drawing Sheets

MOS DEVICES WITH MODULATED PERFORMANCE AND METHODS FOR FORMING THE SAME

BACKGROUND

In integrated circuits, the performance of P-type Metal-Oxide-Semiconductor (PMOS) devices and N-type Metal-Oxide-Semiconductor (NMOS) devices often need to be modulated to suit to the customized requirements of different circuits. For example, some circuits may prefer the PMOS and the NMOS devices therein to have different saturation currents than the PMOS and the NMOS devices in other circuits.

In existing circuits, the modulation of the PMOS and NMOS devices were achieved by adjusting the gate sizes of the PMOS or NMOS devices. However, since the gates of the PMOS devices and NMOS devices in a local region (such as a core region and an Input/output (IO) region) were formed simultaneously, the gates of the PMOS devices and NMOS devices in the local region have a same size. The adjustment in the PMOS devices thus also adversely affects the performance of the NMOS devices, and vice versa.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A circuit structure including P-type Metal-Oxide-Semiconductor (PMOS) devices having modulated performance and the method of forming the same are provided in accordance with various embodiments. The intermediate stages of forming the PMOS devices are illustrated. The variations of the embodiments are then discussed. Throughout the various views and illustrative embodiments, like reference numbers are used to designate like elements.

Figure 1:
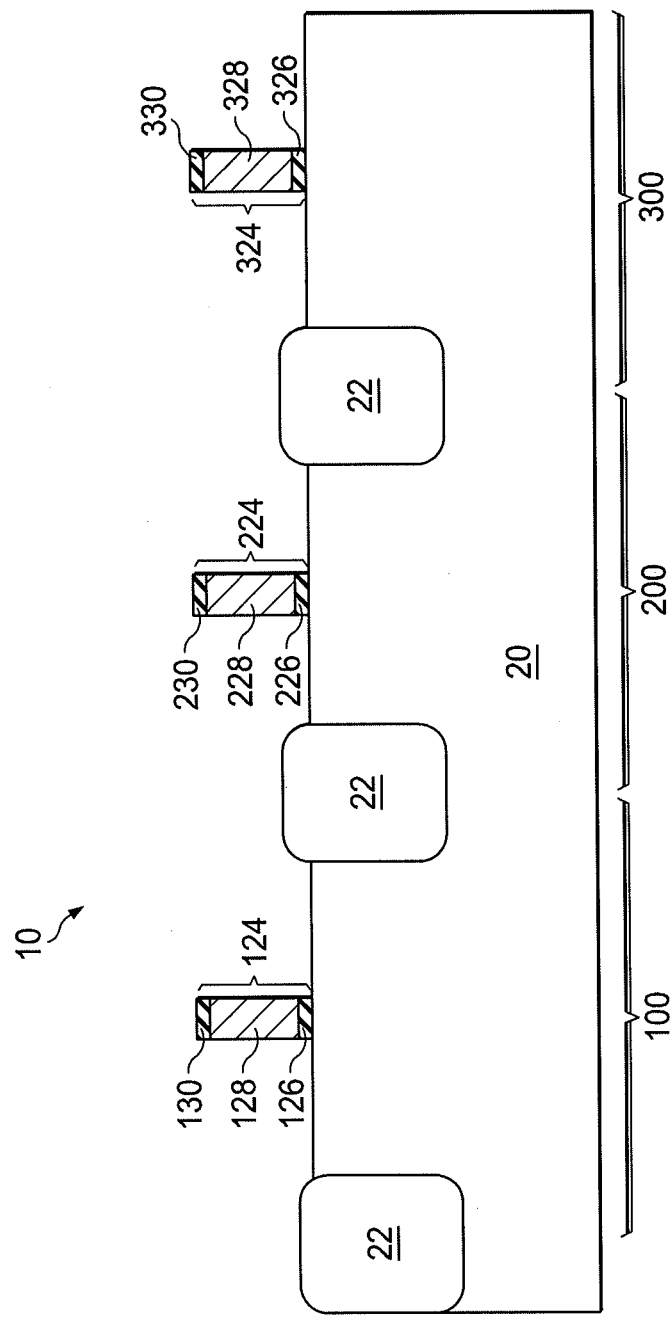
FIGS. 1 through 10 are cross-sectional views of intermediate stages in the manufacturing of Metal-Oxide-Semiconductor (MOS) devices in accordance with various embodiments.

FIGS. 1 through 10 are cross-sectional views of intermediate stages in the manufacturing of PMOS devices in accordance with various embodiments. FIG. 1 illustrates a portion of semiconductor substrate 20, which may be a portion of semiconductor wafer 10. In some embodiments, substrate 20 is a silicon substrate. In other embodiments, substrate 20 may comprise semiconductor materials such as strained semiconductor, or compound semiconductor such as silicon germanium or III-V semiconductor material. Substrate 20 may also be a bulk semiconductor substrate such as a bulk silicon substrate, a silicon-on-insulator (SOI) substrate, or the like.

Wafer 10 includes first PMOS region 100, second PMOS region 200, and N-type Metal-Oxide-Semiconductor (NMOS) region 300. In accordance with some embodiments, PMOS regions 100 and 200 are different device regions that are selected from exemplary device regions such as logic device regions, memory device regions, low threshold voltage device regions, high threshold voltage device regions, standard threshold voltage device regions, and the like. N-well regions (not shown) may be formed in PMOS regions 100 and 200.

In PMOS region 100, gate stack 124 is formed on substrate 20. Gate stack 124 may include gate dielectric 126, gate electrode 128, and hard mask 130. In PMOS region 200, gate stack 224 is formed on substrate 20. Gate stack 224 may include gate dielectric 226, gate electrode 228, and hard mask 230. In NMOS region 300, gate stack 324 is formed on substrate 20. Gate stack 324 may include gate dielectric 326, gate electrode 328, and hard mask 330. Gate stacks 124 and 224 may be formed simultaneously. In some embodiments, gate stacks 124 and 224 may also be formed simultaneously with gate stack 324. In alternative embodiments, gate stack 324 is formed in different steps than for forming gate stacks 124 and 224.

In accordance with some exemplary embodiments, gate dielectrics 126, 226, and 326 may include silicon oxide, oxynitride, oxygen-containing dielectric, nitrogen-containing dielectric, high-k dielectric materials, and combinations thereof. In some embodiments, gate electrodes 128, 228, and 328 comprise polysilicon. In other embodiments, gate electrodes 128, 228, and/or 328 comprise amorphous silicon, metal, metal silicides, or the like. Hard masks 130, 230, and 330 may include silicon nitride. The formation methods for forming gate stacks 124, 224, and 324 may include Chemical Vapor Deposition (CVD) methods. Gate electrodes 128, 228, and/or 328 may be doped to reduce sheet resistance. Although not shown, lightly doped source/drain (LDD) regions and pocket regions may be formed to adjacent to each or some of gate stacks 124, 224, and 324.

Figure 2:
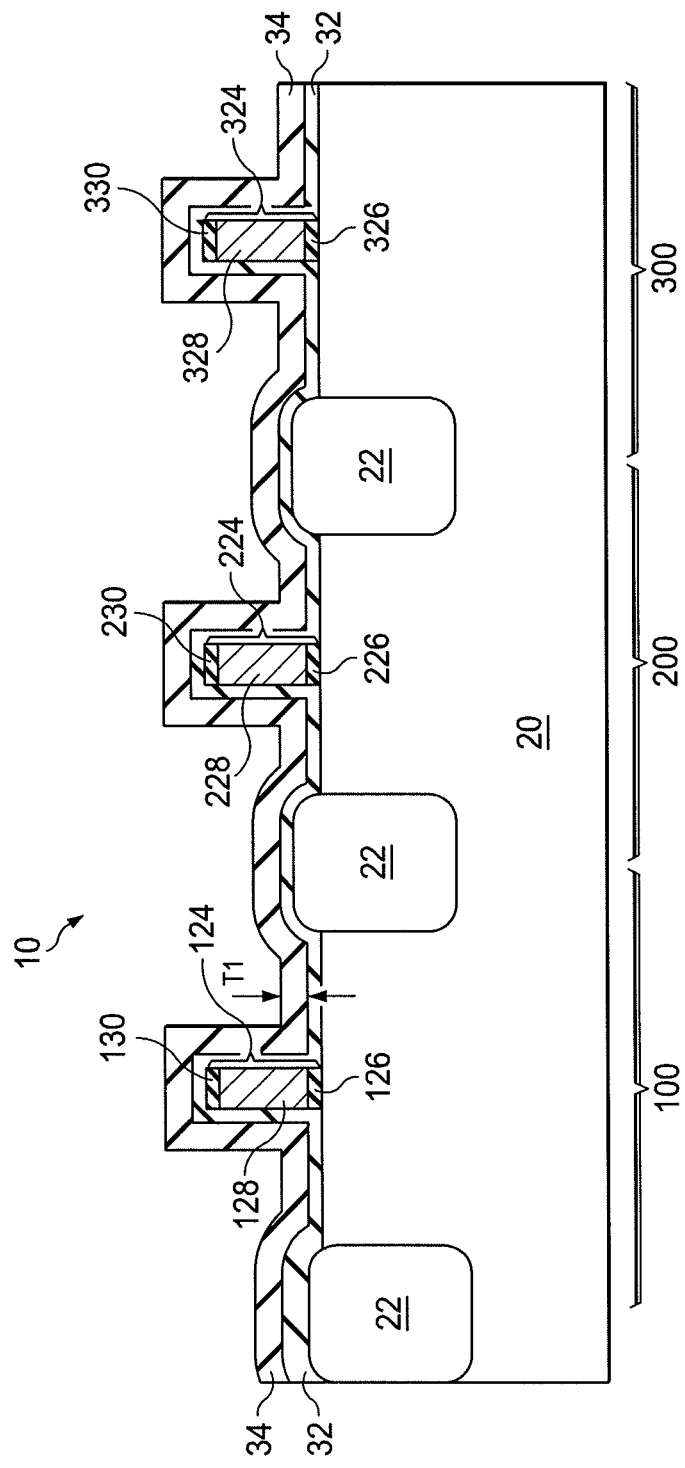

Referring to FIG. 2, spacer layers 32 and 34 are formed, wherein spacer layer 34 is formed over spacer layer 32. In some embodiments, spacer layer 32 comprises silicon oxide, while spacer layer 34 comprises silicon nitride. Spacer layers 32 and 34 extend into device regions 100, 200, and 300, and are formed on the top surfaces and sidewalls of gate stacks 124, 224, and 324. Spacer layer 34 may have thickness T1 smaller than about 300 Å, for example. It is realized, however, that the dimensions recited throughout the description are merely examples, and may be changed to different values.

Figure 3:
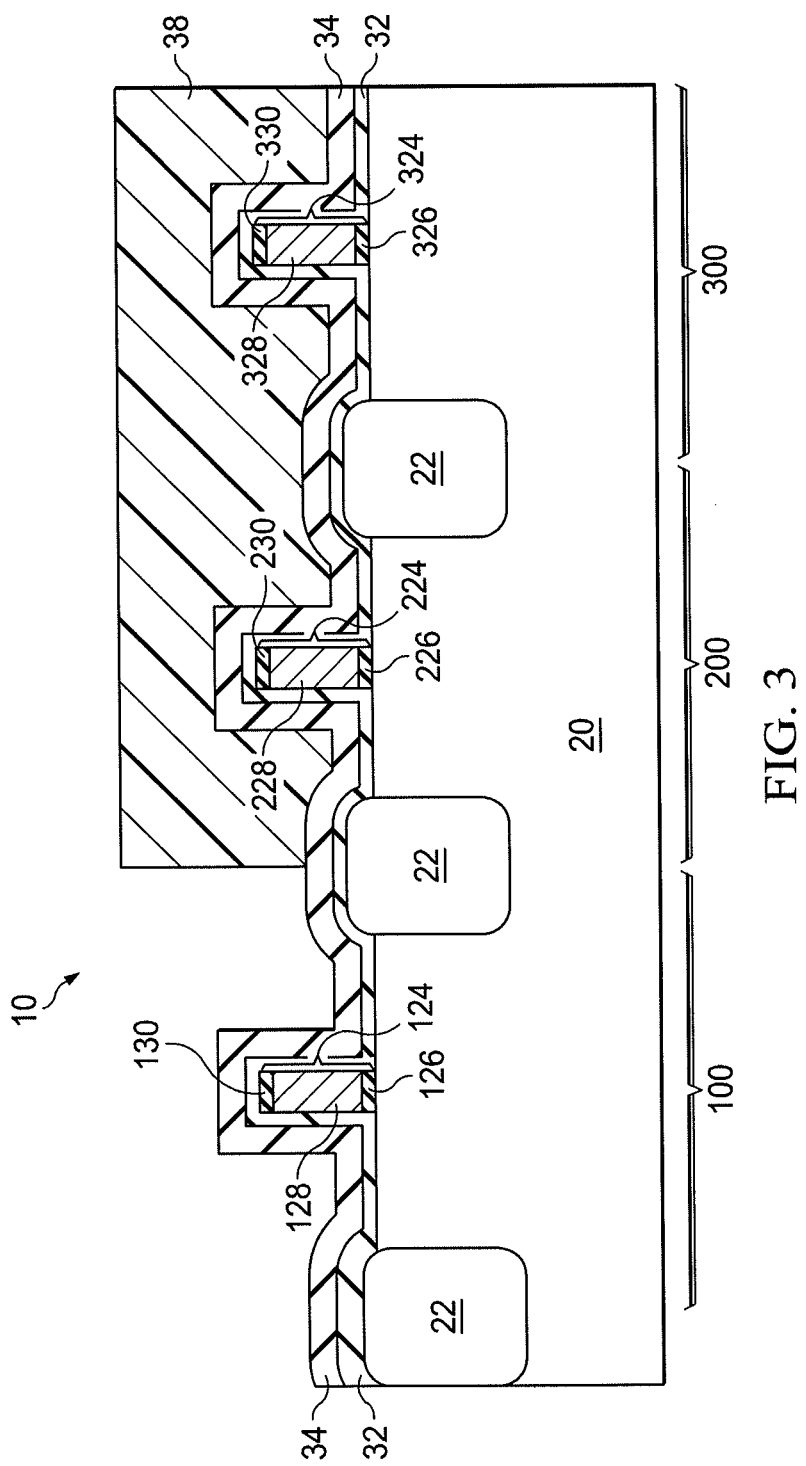
Figure 4A:
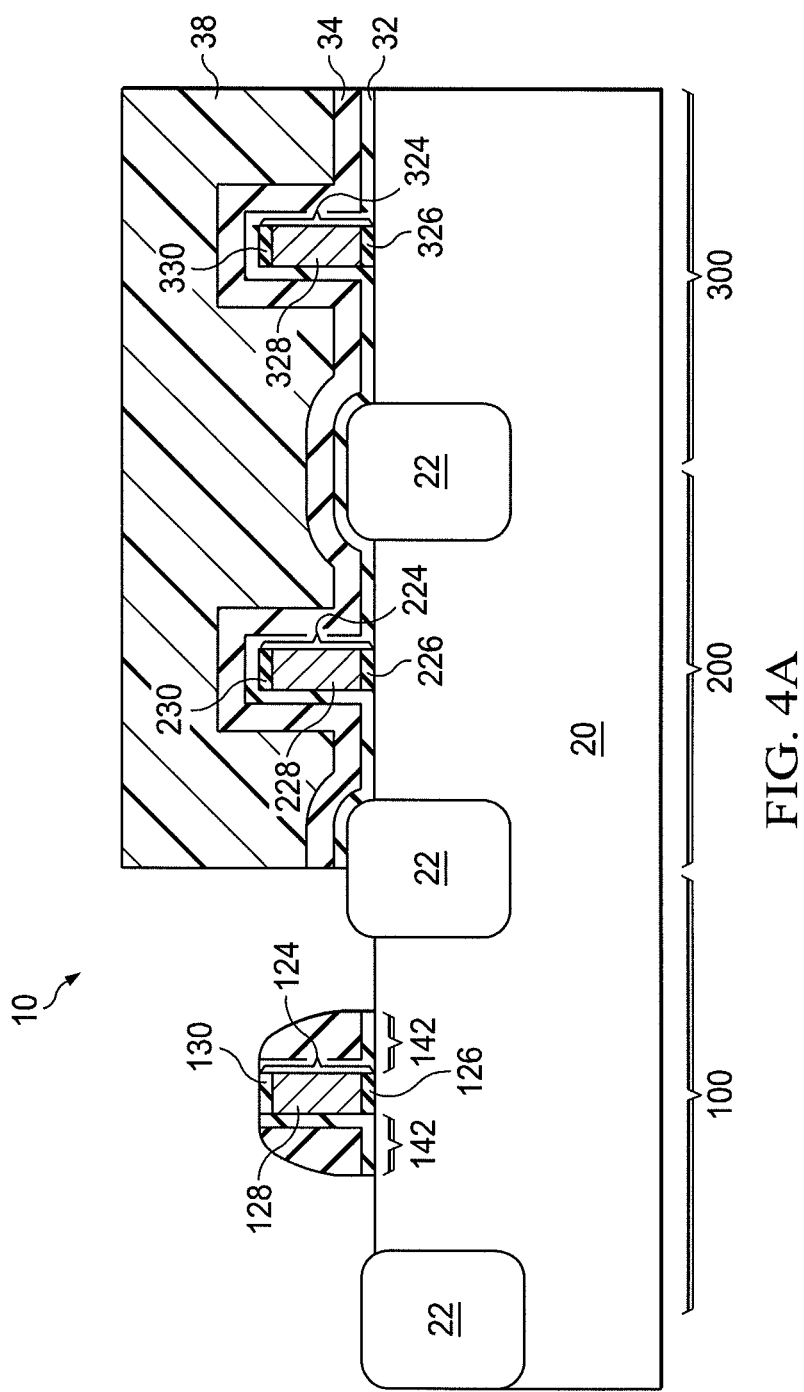
Figure 4B:
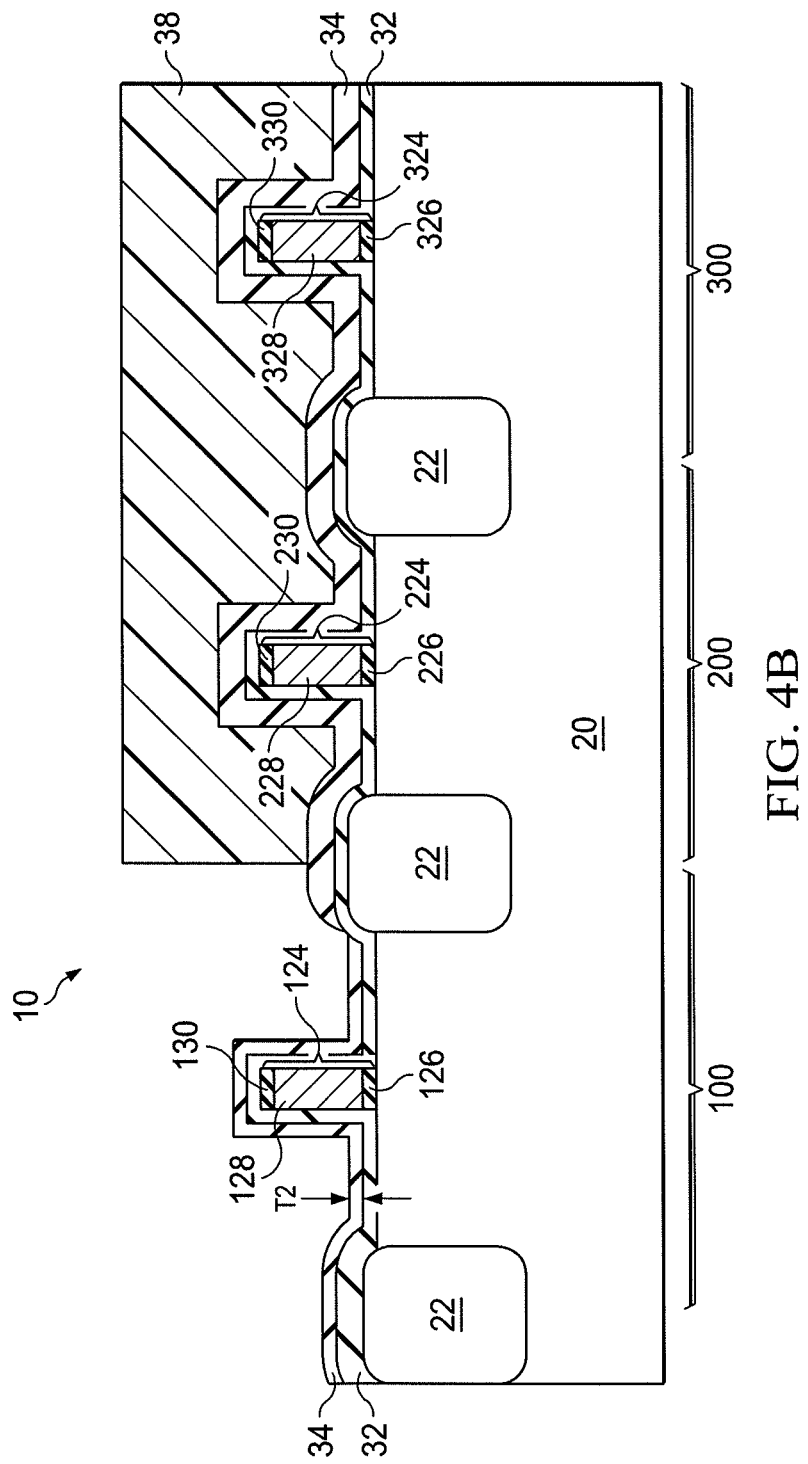

In FIG. 3, photo resist 38 is formed and patterned. The patterned photo resist 38 covers PMOS region 200 and NMOS region 300, while PMOS region 100 is not covered. Next, as shown in FIGS. 4A and 4B, portions of spacer layers 32 and 34 in PMOS region 100 are etched. In some embodiments, as shown in FIG. 4A, an anisotropic etch step is performed to etch spacer layer 34, so that the horizontal portions of spacer layer 34 are removed, while some sidewall portions of spacer layer 34 that are on the sidewalls of gate stack 124 remain un-etched. The etching of spacer layer 34 may last between about 1 second and about 10 seconds, for example. An additional etch is then preformed to remove portions of spacer layer 32 that were covered by the horizontal portions of spacer layer 34. In the resulting structure as shown in FIG. 4A, dummy spacers 142 are formed. In each of dummy spacers 142, the remaining portion of spacer layer 32 includes a horizontal leg and a vertical leg, wherein the remaining portions of spacer layer 34 reside on the horizontal legs of spacer layer 32.

In alternative embodiments, as shown in FIG. 4B, the etch of spacer layer 34 results in the thinning of spacer layer 34. The horizontal portions of spacer layer 34, however, are not fully removed. Thickness T2 of the resulting thinned spacer layer 34 is thus smaller than thickness T1 in FIG. 2. In some embodiments, thickness T2 may be smaller than about 90 percent thickness T1, or smaller than about 80 percent thickness T1. As a result, spacer layer 32 is protected by spacer layer 34, and the horizontal portions of spacer layer 32 are also not removed.

Figure 5:
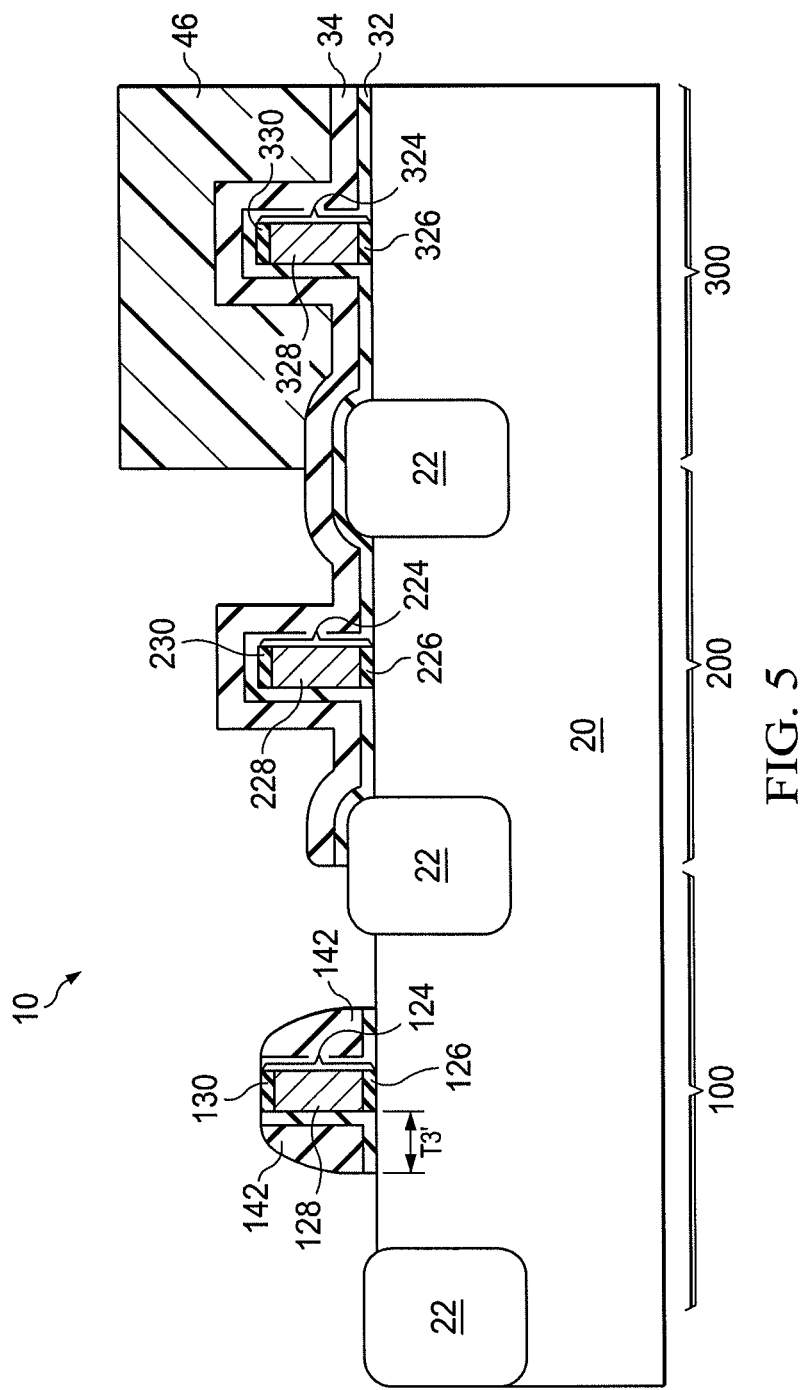
Figure 6:
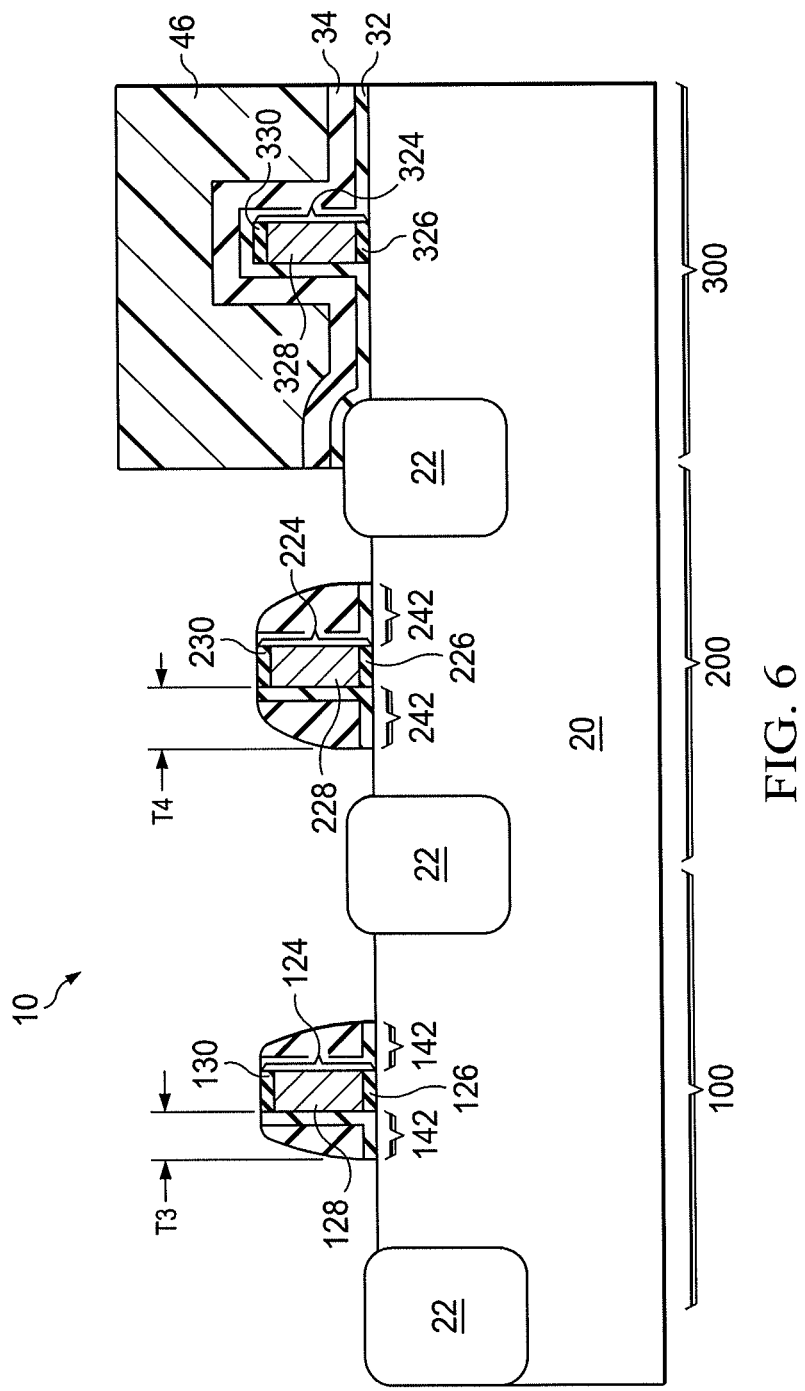

Referring to FIG. 5, photo resist 38 is removed. A second photo resist 46 is formed and patterned. Photo resist 46 covers NMOS region 300, while PMOS regions 100 and 200 are not covered. Next, as shown in FIG. 6, portions of spacer layers 32 and 34 in PMOS region 200 are etched to form dummy spacers 242, for example, by using an anisotropic etch step. In PMOS region 200, the horizontal portions of spacer layer 34 are removed, while some sidewall portions of spacer layer 34 remain on the sidewalls of gate stack 224. The etching of spacer layer 34 may last between about 5 seconds and about 30 seconds in some exemplary embodiments. An additional etch is then preformed to remove portions of spacer layer 32 that were covered by the horizontal portions of spacer layer 34. As a result, dummy spacers 242 are formed on the sidewalls of gate stack 224.

PMOS region 100 is also subject to the etching when the etching in PMOS region 200 is performed. If dummy spacers 142 have already been formed as shown in FIG. 4A, dummy spacers 142 in FIG. 4A will be further etched to form dummy spacers 142 in FIG. 6, wherein the dummy spacers 142 in FIG. 6 have a smaller thickness T3 than thickness T3' of dummy spacers 142 in FIG. 5. Alternatively, if in the preceding etching step, the structure as shown in FIG. 4B was formed, then spacer layer 34 is further etched, with its horizontal portions removed. The horizontal portions of spacer layer 32 are also removed. The resulting dummy spacers 142 are also illustrated as in FIG. 6.

Since the total etching time for forming dummy spacers 142 is longer than the etching time for forming dummy spacers 242, thickness T3 of dummy spacers 142 is smaller than thickness T4 of dummy spacers 242. In some exemplary embodiments, thickness T3 may be less than about 20 percent thickness T4, or smaller than about 5 percent thickness T4. Furthermore, the thickness difference (T4−T3) may be greater than about 1 Å, greater than about 5 Å, or greater than about 100 Å in accordance with some exemplary embodiments. In some other exemplary embodiments, thickness T3 is smaller about 50 Å, while thickness T4 may be between about 2 Å and about 100 Å.

Figure 7:
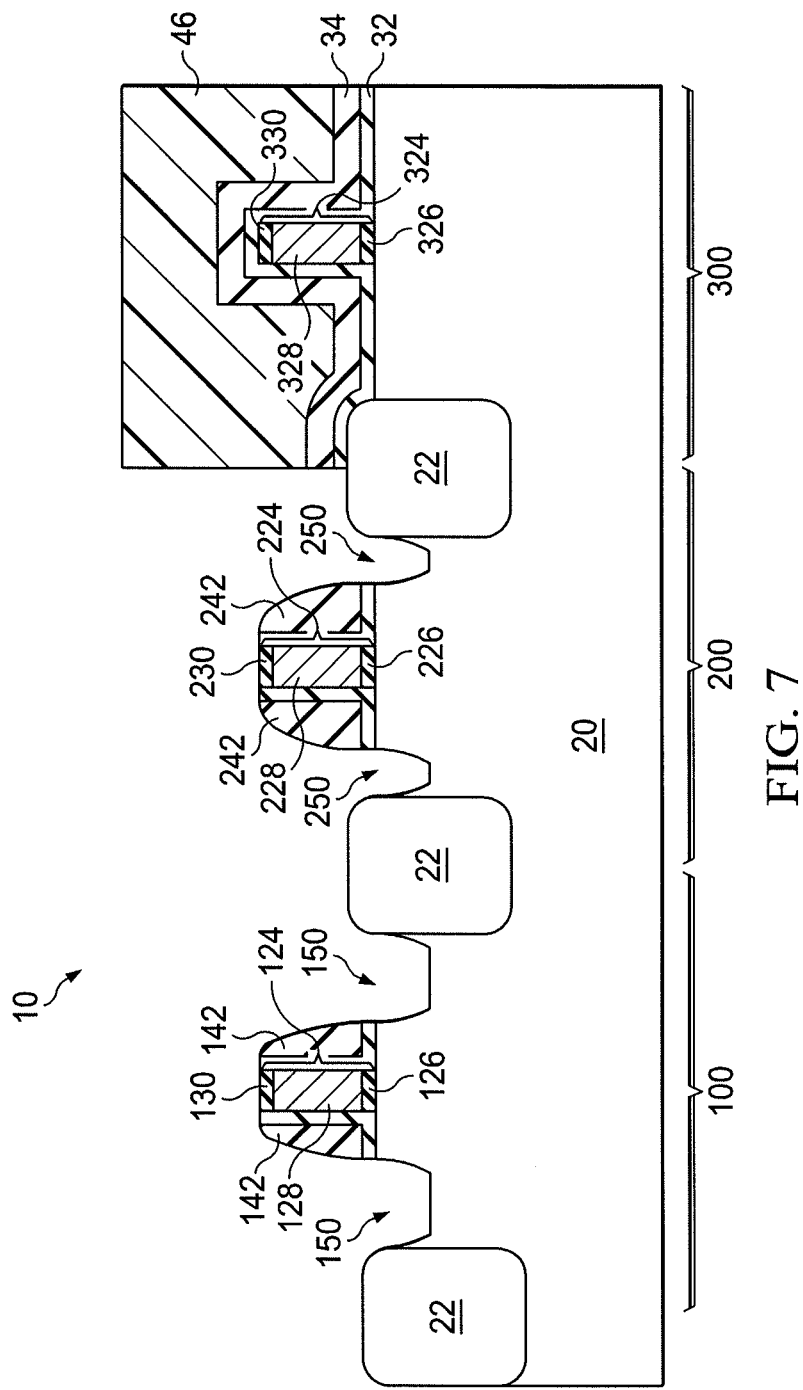
Figure 8:
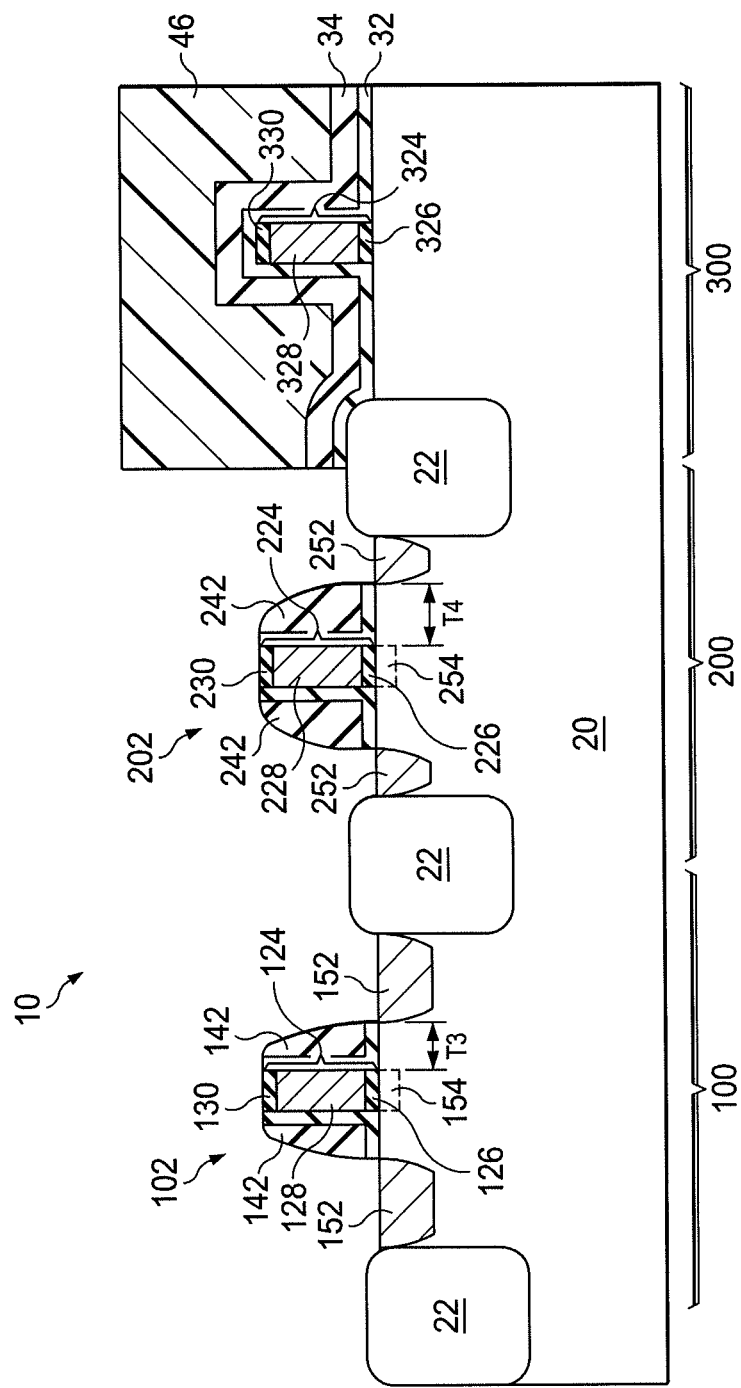

Referring to FIG. 7, a recessing step is performed, and recesses 150 are formed in PMOS region 100 and adjacent to dummy spacers 142. Recesses 250 are also simultaneously formed in PMOS region 200 and adjacent to dummy spacers 242. The inner edge of recesses 150 and 250 may be substantially aligned to outer edges of the respective dummy spacers 142 and 242, respectively. The formation of recesses 150 and 250 may be simultaneously performed using photo resist 46 as the etching mask. A cleaning is then performed to clean the exposed surfaces of substrate 20 in recesses 150 and 250. Next, as shown in FIG. 8, an epitaxy step is performed to form epitaxy regions 152 and 252, which are alternatively referred to as stressors 152 and 252 hereinafter. In some embodiments, stressors 152 and 252 comprise silicon germanium. During the epitaxy, a p-type impurity such as boron or indium may be in-situ doped with the proceeding of the epitaxy process. In alternative embodiments, no p-type impurity is in-situ doped. Since stressors 152 and 252 may be formed simultaneously, stressors 152 may comprise same elements as stressors 252. Furthermore, the atomic percentages of the corresponding elements in stressors 152 and 252 are the same as each other. For example, the silicon atomic percentage in stressors 152 is the same as the silicon atomic percentage in stressors 252, and the germanium atomic percentage in stressors 152 is the same as the germanium atomic percentage in stressors 252.

Since stressors 152 and 252 have a greater lattice constant than the lattice constant of silicon, compressive stresses may be applied to channel regions 154 and 254. It is noted that the lateral distance between stressors 152 and channel region 154 is substantially equal to T3, while the lateral distance between stressors 252 and channel region 254 is substantially equal to T4. As shown in FIG. 8, thickness T3 is equal to the lateral distance from stressors 152 to the respective channel region 154, and is also equal to the lateral distance from stressors 152 to the respective gat stack 124. Thickness T4 is equal to the lateral distance from stressors 252 to the respective channel region 254, and is also equal to the lateral distance from stressors 252 to the respective gat stack 224. Since T3 is smaller than T4, stressors 152 are closer to the respective channel region 154 than stressors 252 to the respective channel region 254. Accordingly, the stress applied by stressors 152 to channel region 154 may be greater than the stress applied by stressors 252 to channel region 254. The PMOS device 102 in PMOS region 100 may thus have a greater saturation current than the PMOS device 202 in PMOS region 200.

Figure 9:
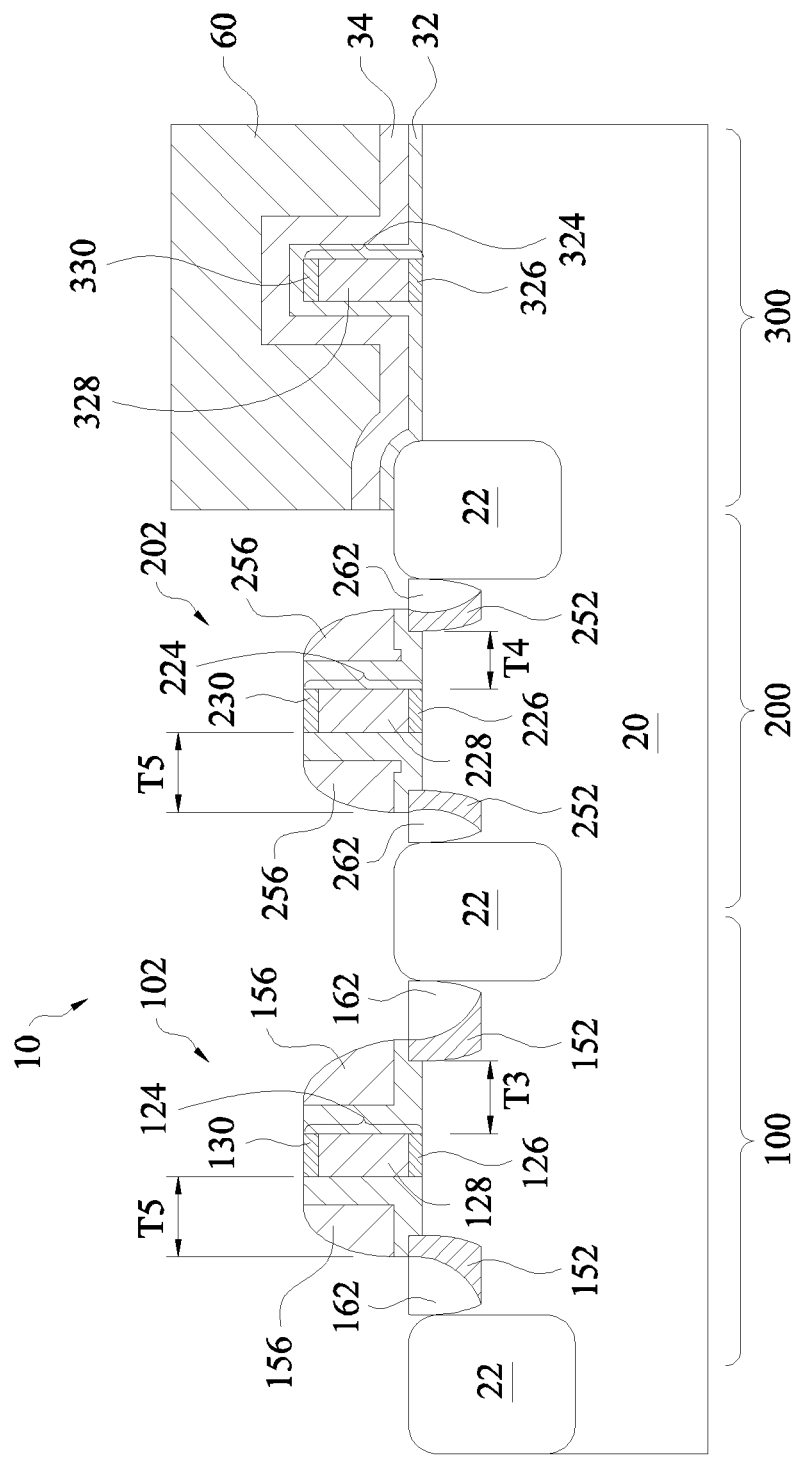

Referring to FIG. 9, dummy spacers 142 and 242 are removed, and photo resist 46 is also removed. Spacers 156 and 256 are then formed. Spacers 156 and 256 may be wider than dummy spacers 142 and 142. Spacers 156 and 256 may be formed with the help of additional photo resist 60. In some embodiments, spacers 156 and 256 may overlap portions of stressors 152 and 252, respectively. Spacers 156 and 256 may be formed simultaneously, and hence have the same thickness T5. FIG. 9 also illustrates the formation of deep source/drain regions 162 in PMOS region 100 and deep source/drain regions 262 in PMOS region 200. In some embodiments, deep source/drain regions 162 and 262 are formed by implanting impurities into semiconductor substrate 20, wherein spacers 156 and 256 are used as implantation masks. In the implantation, a p-type impurity such as boron or indium is implanted, so that deep source/drain regions 162 and 262 are of p-type.

Figure 10:
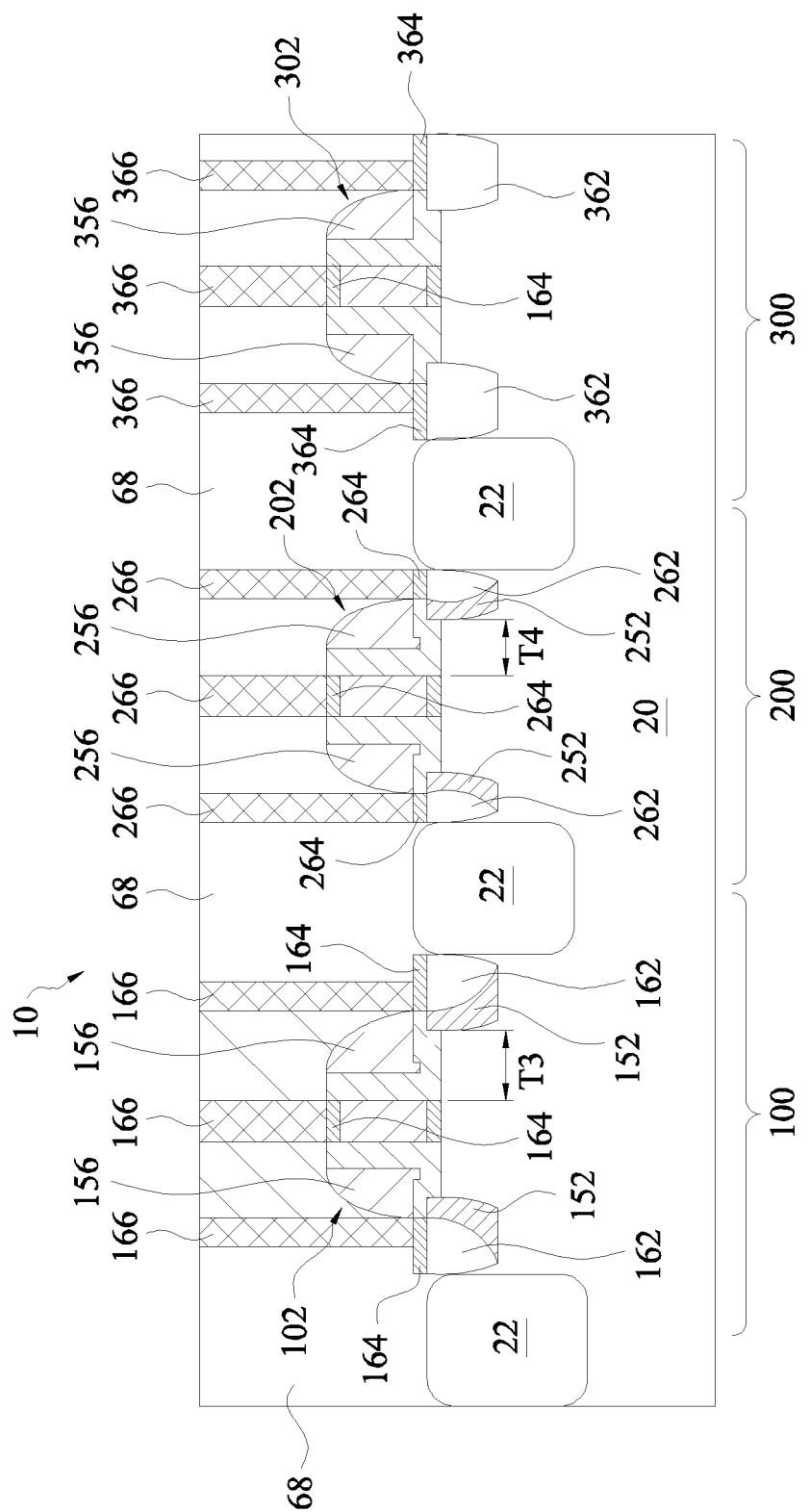

FIG. 10 illustrates the formation of NMOS device 302 and remaining regions of PMOS devices 102 and 202. It is noted that although FIGS. 9 and 10 illustrate that NMOS device 302 is formed after the formation of spacers 156/256 and deep source/drain regions 162/262, in alternative embodiments, NMOS device 302 may be earlier, for example, before the formation of spacers 156/256 and deep source/drain regions 162/262. Furthermore, spacers 156, 256, and 356 may be formed simultaneously. The additional regions of PMOS devices 102 and 202 include silicide regions 164 and 264 and contact plugs 166 and 266. NMOS device 302 includes gate spacers 356 and deep source/drain regions 362, silicide regions 364, and contact plugs 366. Contact plugs 166, 266, and 366 are formed in inter-layer dielectric 68.

In accordance with embodiments, in the formation of PMOS devices, the dummy spacers of different PMOS devices have different thicknesses. Accordingly, the device performance of PMOS devices may be modulated through the adjustment of the thicknesses of the dummy spacers of PMOS devices. Such modulation method does not result in the adverse increase in the leakage currents of the PMOS devices. Furthermore, the modulation of the PMOS device performance does not affect the performance of NMOS devices.

Although the above-discussed embodiments provide a method of modulating PMOS device performance, one of ordinary skill in the art will realize that the teaching of the embodiments is readily available for modulating the NMOS device performance. For example, in the embodiments shown in FIGS. 1 through 10, device regions 100 and 200 may be NMOS device regions, while device region 300 may be a PMOS device region. The dummy spacers in device regions 100 and 200 are accordingly used for forming stressors that apply tensile stresses to the channel regions of the respective NMOS devices in device regions 100 and 200. The respective stressors in the respective NMOS device regions 100 and 200 may comprise silicon carbon, for example.

In accordance with embodiments, a device includes a semiconductor substrate, a first MOS device, and a second MOS device of a same conductivity as the first MOS device. The first MOS device includes a first gate stack over the semiconductor substrate, and a first stressor adjacent to the first gate stack and extending into the semiconductor substrate. The first stressor and the first gate stack have a first distance. The second MOS device includes a second gate stack over the semiconductor substrate, and a second stressor adjacent to the second gate stack and extending into the semiconductor substrate. The second stressor and the second gate stack have a second distance greater than the first distance.

In accordance with other embodiments, a device includes a silicon substrate, a first PMOS device, and a second PMOS device. The first PMOS device includes a first gate stack over the silicon substrate, and a first silicon germanium stressor adjacent the first gate stack and extending into the semiconductor substrate. The first silicon germanium stressor and the first gate stack have a first distance. The second PMOS device includes a second gate stack over the silicon substrate, and a second silicon germanium stressor adjacent the second gate stack and extending into the silicon substrate. The second silicon germanium stressor and the second gate stack have a second distance greater than the first distance.

In accordance with yet other embodiments, a method includes forming a first gate stack and a second gate stack over a semiconductor substrate, forming a first dummy spacer on a sidewall of the first gate stack, and forming a second dummy spacer on a sidewall of the second gate stack. The first dummy spacer has a first thickness smaller than a second thickness of the second dummy spacer. The method further includes forming a first recess in the semiconductor substrate and adjacent the first gate stack, with the first dummy spacer used as a mask for forming the first recess, and forming a second recess in the semiconductor substrate and adjacent the second gate stack. The second dummy spacer is used as a mask for forming the second recess. The method further includes forming a first epitaxy region in the first recess, and forming a second epitaxy region in the second recess. The first and the second epitaxy regions apply a same type of stress to a first channel region and a second channel region, respectively. The first and the second channel regions are under the first gate stack and the second gate stack, respectively.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a semiconductor substrate;
   a first Metal-Oxide-Semiconductor (MOS) device comprising:
      a first gate stack over the semiconductor substrate; and
      a first stressor adjacent the first gate stack and extending into the semiconductor substrate, wherein the first stressor and the first gate stack have a first distance; and
   a second MOS device of a same conductivity as the first MOS device, wherein the second MOS device comprising:
      a second gate stack over the semiconductor substrate; and
      a second stressor adjacent the second gate stack and extending into the semiconductor substrate, wherein the second stressor and the second gate stack have a second distance greater than the first distance.

2. The device of claim 1, wherein the first and the second MOS devices are P-type MOS (PMOS) devices.

3. The device of claim 2, wherein the first and the second stressors comprise silicon germanium.

4. The device of claim 1, wherein the first MOS device further comprises a first gate spacer on a sidewall of the first gate stack, wherein the second MOS device further comprises a second gate spacer on a sidewall of the second gate stack, and wherein the first and the second gate spacers have a same thickness.

5. The device of claim 4, wherein the first gate spacer comprises a portion over and overlapping a portion of the first stressor, and wherein the second gate spacer comprises a portion over and overlapping a portion of the second stressor.

6. The device of claim 1, wherein the first distance is smaller than about 5 percent the second distance.

7. The device of claim 1, wherein a difference between the second distance and the first distance is greater than about 100 Å.

8. A device comprising:
   a silicon substrate;
   a first p-type Metal-Oxide-Semiconductor (PMOS) device comprising:
      a first gate stack over the silicon substrate; and
      a first silicon germanium stressor adjacent the first gate stack and extending into the silicon substrate, wherein the first silicon germanium stressor and the first gate stack have a first distance; and
   a second PMOS device comprising:
      a second gate stack over the silicon substrate; and
      a second silicon germanium stressor adjacent the second gate stack and extending into the silicon substrate, wherein the second silicon germanium stressor and the second gate stack have a second distance greater than the first distance.

9. The device of claim 8 further comprising:
   a first dummy spacer on a sidewall of the first gate stack, wherein the first dummy spacer has an edge substantially aligned to an edge of the first silicon germanium stressor; and a second dummy spacer on a sidewall of the second gate stack, wherein the second dummy spacer has an edge substantially aligned to an edge of the second silicon germanium stressor, and wherein the first and the second dummy spacers have different thicknesses.

10. The device of claim 8, wherein the first silicon germanium stressor and the second silicon germanium stressor have a same germanium atomic percentage.

11. The device of claim 8, wherein the first PMOS device further comprises a first gate spacer on a sidewall of the first gate stack, wherein the second PMOS device further comprises a second gate spacer on a sidewall of the second gate stack, and wherein the first and the second gate spacers have a same thickness.

12. The device of claim 11, wherein the first gate spacer comprises a portion over and overlapping a portion of the first silicon germanium stressor, and wherein the second gate spacer comprises a portion over and overlapping a portion of the second silicon germanium stressor.

13. The device of claim 8, wherein the first distance is smaller than about 20 percent the second distance.

14. The device of claim 8, wherein a difference between the second distance and the first distance is greater than about 100 Å.

* * * * *